(12) United States Patent
Coumou et al.

(10) Patent No.: US 9,509,266 B2
(45) Date of Patent: \*Nov. 29, 2016

(54) FEEDBACK CONTROL AND COHERENCY OF MULTIPLE POWER SUPPLIES IN RADIO FREQUENCY POWER DELIVERY SYSTEMS FOR PULSED MODE SCHEMES IN THIN FILM PROCESSING

(71) Applicant: MKS Instruments, Inc., Andover, MA (US)

(72) Inventors: David J. Coumou, Webster, NY (US); Richard Pham, San Jose, CA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,540

(22) Filed: Jul. 7, 2014

(65) Prior Publication Data

US 2014/0306754 A1 Oct. 16, 2014

Related U.S. Application Data

(63) Continuation of application No. 13/403,656, filed on Feb. 23, 2012, now Pat. No. 8,773,019.

(51) Int. Cl.
*H05B 31/26* (2006.01)
*B23K 10/00* (2006.01)
(Continued)

(52) U.S. Cl.
CPC ............. *H03G 1/00* (2013.01); *H03F 1/0211* (2013.01); *H03F 1/56* (2013.01); *H03F 3/189* (2013.01); *H03F 3/20* (2013.01); *H03H 7/40* (2013.01)

(58) Field of Classification Search
CPC ...... H05H 1/46; H05H 1/24; H05H 2240/10; H05H 2240/20; H05H 1/30; H05H 1/36; H05H 2001/4682; H05H 2001/463
See application file for complete search history.

(56) References Cited

U.S. PATENT DOCUMENTS 5,116,482 A \* 5/1992 Setoyama ............... C23C 14/54
 118/723 E
5,175,472 A 12/1992 Johnson, Jr. et al.
(Continued)

FOREIGN PATENT DOCUMENTS

CN 1822745 A 8/2006
EP 0549479 A1 6/1993
(Continued)

OTHER PUBLICATIONS

Chinese Office Action for Application No. 2013100562184 dated Sep. 22, 2014, and its English translation thereof.
(Continued)

*Primary Examiner* — Tung X Le
*Assistant Examiner* — Raymond R Chai
(74) *Attorney, Agent, or Firm* — Harness, Dickey & Pierce, P.L.C.

(57) ABSTRACT

A RF power supply system for delivering periodic RF power to a load. A power amplifier outputs a RF signal to the load. A sensor measures the RF signal provided to the load and outputs signals that vary in accordance with the RF signal. A first feedback loop enables control the RF signal based upon power determined in accordance with output from the sensor. A second feedback loop enables control the RF signal based upon energy measured in accordance with signals output from the sensor. Energy amplitude and duration provide control values for varying the RF signal. The control system and techniques are applicable to both pulsed RF power supplies and in various instances to continuous wave power supplies.

38 Claims, 10 Drawing Sheets

(51) Int. Cl.

| | | |
|---|---|---|
| H03G 1/00 | (2006.01) | |
| H03H 7/40 | (2006.01) | |
| H03F 1/02 | (2006.01) | |
| H03F 1/56 | (2006.01) | |
| H03F 3/189 | (2006.01) | |
| H03F 3/20 | (2006.01) | |

(56) References Cited

U.S. PATENT DOCUMENTS

| | | | |
|---|---|---|---|
| 5,556,549 A * | 9/1996 | Patrick | H01J 37/32082 118/712 |
| 5,859,501 A | 1/1999 | Chi | |
| 5,892,198 A * | 4/1999 | Barnes | H01J 37/32082 219/121.43 |
| 5,936,481 A | 8/1999 | Fujii | |
| 6,252,354 B1 | 6/2001 | Collins et al. | |
| 6,326,584 B1 * | 12/2001 | Jewett | H01J 37/32082 219/121.54 |
| 6,472,822 B1 | 10/2002 | Chen et al. | |
| 6,700,092 B2 | 3/2004 | Vona, Jr. et al. | |
| 6,954,077 B2 * | 10/2005 | Strang | H01J 37/32192 324/636 |
| 6,970,700 B1 | 11/2005 | Keane et al. | |
| 6,983,215 B2 * | 1/2006 | Coumou | H01J 37/32935 702/106 |
| 7,049,751 B2 * | 5/2006 | Blackburn | H01J 37/32082 204/298.08 |
| 7,115,185 B1 | 10/2006 | Gonzalez et al. | |
| 7,304,438 B2 * | 12/2007 | Kishinevsky | H01J 37/32082 315/224 |
| 7,368,876 B2 * | 5/2008 | Hayami | H01J 37/32174 315/111.11 |
| 7,839,223 B2 | 11/2010 | Van Zyl et al. | |
| 8,334,700 B2 * | 12/2012 | Coumou | G01R 19/0061 156/345.28 |
| 2005/0227646 A1 | 10/2005 | Yamazaki et al. | |
| 2006/0220656 A1 | 10/2006 | Tanaka et al. | |
| 2008/0105538 A1 | 5/2008 | Winterhalter et al. | |
| 2009/0218324 A1 | 9/2009 | Or et al. | |
| 2009/0294061 A1 | 12/2009 | Shannon et al. | |
| 2009/0294275 A1 | 12/2009 | Shannon et al. | |
| 2009/0294414 A1 | 12/2009 | Shannon et al. | |
| 2009/0295295 A1 | 12/2009 | Shannon et al. | |
| 2009/0295296 A1 | 12/2009 | Shannon et al. | |
| 2009/0297404 A1 | 12/2009 | Shannon et al. | |
| 2009/0298287 A1 | 12/2009 | Shannon et al. | |
| 2010/0201370 A1 * | 8/2010 | Coumou | G01R 19/0061 324/536 |
| 2011/0032047 A1 * | 2/2011 | Yuzurihara | H01J 37/32082 332/108 |

FOREIGN PATENT DOCUMENTS

| | | |
|---|---|---|
| EP | 0677221 A1 | 10/1995 |
| JP | 57-014207 A | 1/1982 |
| JP | 2005109183 A | 4/2005 |
| JP | 2008117777 A | 5/2008 |
| KR | 20090124119 A | 12/2009 |
| WO | 9847168 A1 | 10/1998 |
| WO | 2009060213 A1 | 5/2009 |
| WO | 2011016266 A1 | 2/2011 |

OTHER PUBLICATIONS

Appeal Decision of Rejection for Japanese Application No. 2013026401 dated Dec. 27, 2015, and a partial English translation thereof.

English Translation of Chinese Office Action for Application No. 2013100562184, dated May 20, 2015.

M.Schaepkens, GS Oehrlein, JM Cook; "Effects of RF bias frequency and RF bias pulsing on SiO2 feature etching in IC fluorocarbon plasmas"; J.Vac.Sci.Tech B18(2) Mar./Apr. 2000, pp. 856-863.

TL Vincent, LL Raja; "Optimal pulse shaping for plasma processing"; IEEE Trans on Control System Technology, vol. 12. No. 1, Jan. 2004, pp. 75-86.

A. Agarwal, P. Stout, S. Banna, S Rauf, K. Tokashiki, J-Y Lee, K. Collins, "Effect of simultaneous source and bias pulsing in inductively coupled plasma etching"; J. Applied Physics 106, 2009.

S. Banna, A. Agarwal, K. Tokashiki, H. Cho, S. Rauf, V. Todorow, K. Ramaswamy, K. Collins, P. Stout, J.-Y. Lee, J. Yoon, K. Shin, S. Choi, H. Cho, H.-J. Kim, C. Lee, and D. Lymberopoulos; "Inductively-coupled pulsed plasmas in the presence of synchronous pulsed substrate bias for robust, reliable and fine conductor etching"; IEEE Trans. Plasma Sci. 37, 1730, 2009.

Tomoyuki Kuroki, Shingo Tanaka, Masaaki Okubo, and Toshiaki Yamamoto; "CF4 Decomposition Using Low-Pressure Pulse-Modulated Radio Frequency Plasma"; JSME International Journal Series B vol. 48 (2005), No. 3 Special Issue on Advanced Fusion of Functional Fluids Engineering pp. 440-447.

O. Joubert; "Synchronized pulsed plasmas: potential process improvements for patterning technologies"; Proceedings of the 63rd Annual Gaseous Electronics Conference and 7th International Conference on Reactive Plasmas; Paris France, Oct. 4-8, 2010.

M. Haass et. al.; "Synchronous Plasma Pulsing for Etch Applications"; Proceedings of the 63rd Annual Gaseous Electronics Conference and 7th International Conference on Reactive Plasmas; Paris France, Oct. 4-8, 2010.

Overzet, L.J., Leong-Rousey, F.Y.; "Time-resolved power impedance measurements of pulsed radio frequency discharges"; Plasma Sources Sci. Technology; 1995, vol. 4, p. 432-443.

J.T. Verdeyen; J. Beberman, and L. Overset; "Modulated discharges: Effect on plasma parameters and deposition"; J. Vac. Sci. Technol. A; 1990, vol. 8, No. 3, p. 1851-1856.

S. Samukaway and T. Mienoz; "Pulse-time modulated plasma discharge for highly selective, highly anisotropic and charge-free etching"; Plasma Sources Sci. Technology; 1996, vol. 5, p. 132-138.

S. Ashida, M. R. Shim, and M. A. Lieberman; "Measurements of pulsed-power modulated argon plasmas in an inductively coupled plasma source"; J. Vac. Sci. Technol. A; 1996, vol. 14, No. 2, p. 391-397.

S Voronin, M Alexander, and J W Bradley; "Time-resolved RF-driven probe measurements of the plasma parameters in a pulsed RF argon discharge"; Meas. Sci. Technol. 15 (2004) 2375-2380.

European Search Report for Application No. 13156252.2/Patent No. 1805, dated Jul. 9, 2013.

Japanese Office Action for Application No. 2013-026401 dated May 13, 2014, and its English translation thereof.

Japanese Office Action dated Sep. 2, 2014 for Application No. 2013-026401, and its English translation thereof.

English Translation of Taiwan Office Action for Application No. 102106273 dated Jul. 12, 2016.

* cited by examiner

FEEDBACK CONTROL AND COHERENCY OF MULTIPLE POWER SUPPLIES IN RADIO FREQUENCY POWER DELIVERY SYSTEMS FOR PULSED MODE SCHEMES IN THIN FILM PROCESSING

CROSS-REFERENCE TO RELATED APPLICATIONS

This application is a continuation of U.S. patent application Ser. No. 13/403,656 filed on Feb. 23, 2012. The entire disclosure of the above application is incorporated herein by reference.

FIELD

The present disclosure relates to radio frequency (RF) generators and to feedback control and coherency of multiple power supplies in a RF power delivery system.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network, and a load, such as a plasma chamber. The RF generator generates RF power signals, which are received at the matching network. The matching network matches an input impedance of the matching network to a characteristic impedance of a transmission line between the RF generator and the matching network. This impedance matching aids in minimizing an amount of power applied to the matching network in a forward direction toward the plasma chamber ("forward power") and reflected back from the matching network to the RF generator ("reverse power"). Impedance matching also assists in maximizing forward power output from the matching network to the plasma chamber.

In the RF power supply field, there are typically two approaches to applying the RF signal to the load. A first, more traditional approach is to apply a continuous wave signal to the load. The continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulsed mode of operation, a RF sinusoidal signal is modulated by a modulation signal in order to define an envelope for the modulated sinusoidal signal. In a conventional pulsed modulation scheme, the RF sinusoidal signal typically is output at a constant frequency and amplitude. Power delivered to the load is varied by varying the modulation signal, rather than varying the sinusoidal, RF signal.

In the typical RF power supply configuration, output power applied to the load is determined by using sensors that measure the forward and reflected power or the voltage and current of the RF signal applied to the load. Either set of these signals is analyzed in a typical feedback loop. The analysis typically determines a power value which is used to adjust the output of the RF power supply in order to vary the power applied to the load. In a RF power delivery system where the load is a plasma chamber, the varying impedance of the load causes a corresponding varying power applied to the load, as applied power is in part a function of the impedance of the load.

Existing methods and apparatus for measuring power at best provide peak and average power information and thus only allow an incomplete view of the RF power variation occurring in the plasma chamber. More specifically, in a pulsed mode of operation, peak and average power of the pulse provide only a narrow view of the RF transients occurring during the pulsed power sequences delivered to the plasma. Such power measurement and feedback systems also sample at rates that are much slower than the modulation intervals and thus do not provide a comprehensive measure of the power delivered to the plasma load during the inevitable impedance variations in the load.

As plasma systems have evolved, many new challenges for both continuous wave and pulsed RF control exist to meet the specifications required to meet critical manufacturing specifications. One advancement is the use of multiple RF sources for increased control of various plasma parameters. These parameters include electron density, electron temperature, ion flux, and ion energy. Dual RF plasma systems have been developed in order to enable independent control of ion energy and ion flux. Thin film processing has evolved to use three RF plasma systems for control of the actual energy distribution of ions incident on the surface of the material, in addition to controlling ion energy and ion flux. Further yet, phase locked high density systems having supplemental RF biasing have become critical to various etching applications. The success of multiple power sources to independently control plasma parameters such as ion flux and ion energy to the surface of a processed material have presented even greater challenges to the delivery of RF power coupling and control in pulsed RF plasma systems.

The transition from continuous wave RF power delivery systems to pulsed RF power delivery systems creates several particular challenges. In a typical plasma system, the power dissipated in the plasma depends upon the impedance of the plasma. If the impedance varies on the timescale of the RF pulse (typically in the range of 1 kHz-10 kHz), so as to not extinguish the plasma between pulse events, the sensors and actuators in the matching network and generator must respond on a similar timescale to provide optimal power coupling to the plasma load. Further, the time response of the impedance is plasma dependent and varies in accordance with factors such as chemistry, pressure, and power coupling. Further yet, the various parasitic elements outside of the plasma, such as resistive loss in the RF coupling antenna or the match system, present a time varying power coupling efficiency during the pulse cycle because they are a constant dissipated impedance in series with a time varying impedance load. Further yet, because the transmitted and reflected power sensors and RF generators are typically calibrated for a matched termination, power compensation due to impedance mismatch can contribute to increased variability in power delivery.

Present pulsed RF systems do not currently provide closed-loop power delivery solutions. Present pulsed RF systems address this problem by attempting to find an acceptable match condition for the pulsed system and run the system in an open loop mode. In this configuration, neither the generator nor the match compensate for power delivery inefficiencies during pulsed operation. This can significantly degrade the accuracy and reproducibility of the power delivery within predefined pulse periods. While faster tuning algorithms have helped address some considerations, they further complicate the power transfer from the source to the load due to the dynamic impedance variation and pulsed mode operation. Further yet, the lack of a closed loop feedback system for pulsed RF systems further limits its use in volume manufacturing where thin film manufacturing includes different plasma chambers and tools.

These considerations continue to limit the use of pulsed RF systems and volume manufacturing despite potential benefits of improved plasma conditions and subsequent surface reactions.

SUMMARY

This section provides a general summary of the disclosure, and is not a comprehensive disclosure of its full scope or all of its features.

A radio frequency (RF) control system includes a power amplifier that outputs a RF signal to a load. A sensor monitors the RF signal and generates a sensor signal based on the RF signal. An energy detection circuit determines an energy of the RF signal in accordance with the sensor signal. A power amplifier energy adjustment circuit generates a control signal for varying the RF signal in accordance with the energy determined by the energy detection circuit.

A radio frequency (RF) control system includes a power amplifier that outputs a RF signal to a load. A sensor monitors the RF signal and generates a sensor signal based on the RF signal. An energy detection circuit determines an energy of the RF signal in accordance with the sensor signal. A power detection circuit determines a power of the RF signal in accordance with the sensor signal. A power amplifier energy adjustment circuit generates a control signal for varying the RF signal in accordance with the energy determined by the energy detection circuit and the power determined by the power detection circuit. The RF signal includes a first signal and a first modulation signal modulating the first signal, and the energy detection circuit determines the energy of the first modulation signal to determine the energy of the RF signal.

A radio frequency (RF) control system includes a plurality of power amplifiers that output a respective RF signal to a load. Each power amplifier includes a power amplifier that outputs a RF signal to a load; a sensor that monitors the RF signal and generates a sensor signal based on the RF signal; an energy detection circuit that determines an energy of the RF signal in accordance with the sensor signal; and a power amplifier energy adjustment circuit that generates a control signal for varying the RF signal in accordance with the energy determined by the energy detection circuit. A RF delivery coordination module controls the phase coherence between the respective RF power supplies.

A radio frequency (RF) control system includes a plurality of power amplifiers that outputs a respective pulsed RF signal to a load. Each power amplifier includes a power amplifier that outputs a RF signal to a load; a sensor monitoring the RF signal and generating a sensor signal based on the RF signal; an energy detection circuit determining an energy of the RF signal in accordance with the sensor signal; and a power amplifier energy adjustment circuit generating a control signal for varying the RF signal in accordance with the energy determined by the energy detection circuit. A RF delivery coordination module synchronizes the respective RF power supplies.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. The present disclosure will become more fully understood from the detailed description and the accompanying drawings, wherein.

Corresponding reference numerals indicate corresponding parts throughout the several views of the drawings.

DETAILED DESCRIPTION

Figure 1:
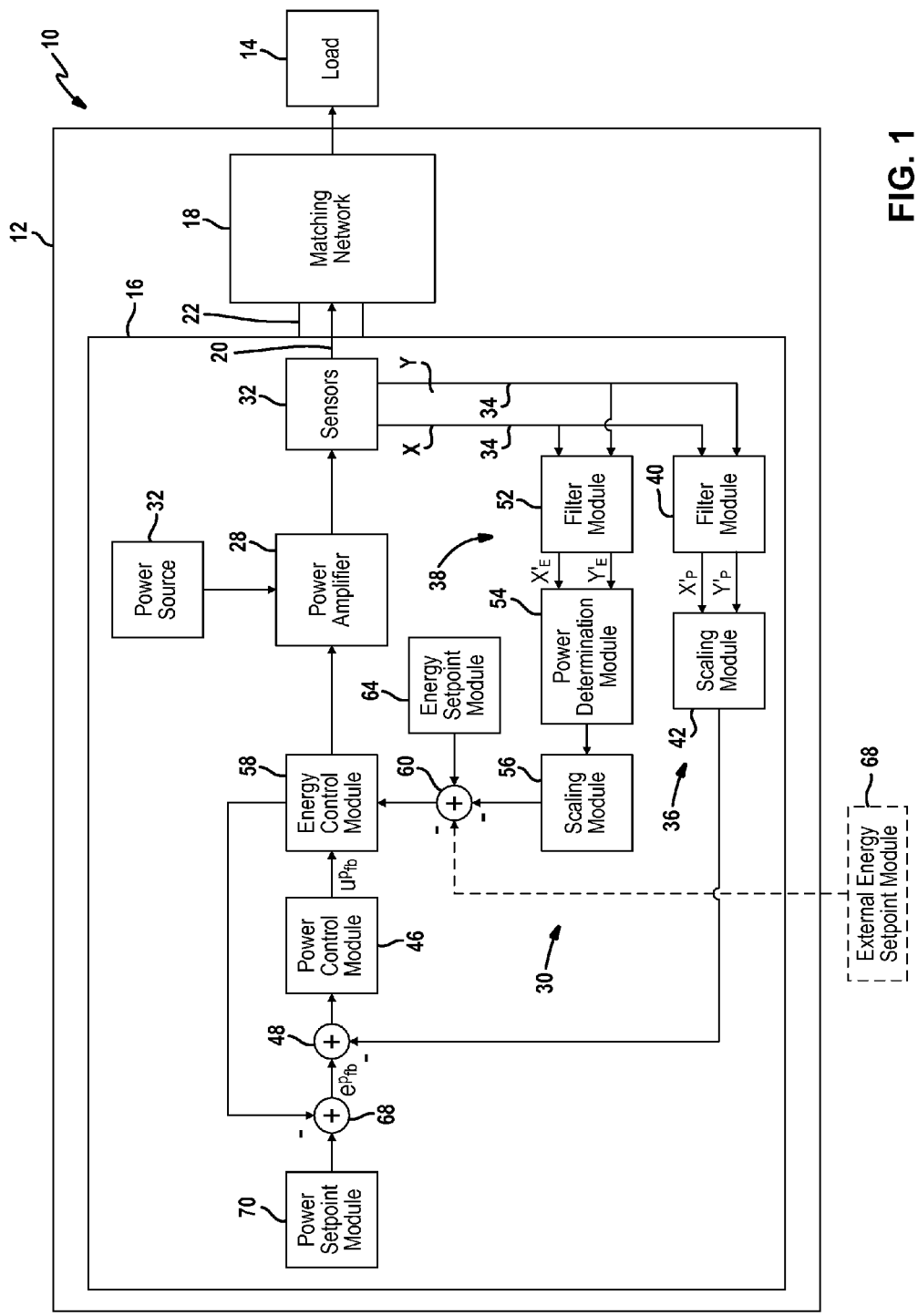
FIG. 1 is a functional block diagram of a RF power system arranged in accordance with the principles of the present disclosure.

Example embodiments will now be described more fully with reference to the accompanying drawings.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed below could be termed a second element, component, loop, circuit or module without departing from the teachings of the example implementations disclosed herein.

In FIG. 1, a RF power system 10 is shown. The RF power system 10 includes a RF power delivery control system 12 and a load 14. The RF power delivery control system 12 further includes a RF power generator and control system 16 (also referred to as a RF generator) and a matching network 18. RF generator 16 generates a RF power signal 20, which is provided to the matching network 18. The matching network 18 matches an input impedance of the matching network 18 to a characteristic impedance of a transmission line 22 between the RF generator 16 and the matching network 18. Put another way, the matching network 18 matches an impedance of the load 14 to an impedance as seen by the output of the RF generator 16. The matching network 18 and the load 14 may be considered as the load on the RF generator 16. The load 14 may be, for example, a plasma chamber or other RF load. The impedance of the load 14 may be static (i.e. unchanging over time) or dynamic (i.e. changing over time).

The RF generator 16 includes a RF power source 28 (or a power amplifier) and a feedback loop 30. The power amplifier 28 generates the RF power signal 20, which is output to the matching network 18. The power amplifier 28 may generate the RF power signal 20 based on a power signal received from a power source 31 external to the power amplifier 28. Although the power source 31 is shown as part of the RF generator 16, the power source 32 may be external to the RF generator 16. The power source 32 may be, for example, a direct current (DC) power source.

Feedback loop 30 includes a pair of feedback loops, each providing feedback for a respective parameter that enables feedback control of RF generator 16. Feedback loop 30 includes one or more sensors 32. The sensors 32 may include voltage, current, and/or directional coupler sensors. The sensors 32 may detect (i) voltage V and current I output of the power amplifier 28, and/or (ii) forward (or source) power PFWD out of the power amplifier 28 and/or RF generator 16 and reverse (or reflected) power PREV received from the matching network 18. The voltage V, current I, forward power PFWD, and reverse power PREV may be scaled versions of the actual voltage, current, forward power and reverse power of the output of the power amplifier 20. The sensors 32 may be analog and/or digital sensors. In a digital implementation, the sensors 32 may include analog-to-digital (A/D) converters and signal sampling components with corresponding sampling rates. The output from sensors 32 can generally be referred as a first signal X and a second signal Y, which may represent various analog or digital implementations.

Feedback loop 30 includes a pair of feedback loops that each receive sensor signals 34 output by sensors 32 to determine a respective parameter to enable feedback control of RF generator 16. A first or outer of the respective feedback loops comprises a power feedback loop 36 for power regulation. A second or inner of the respective feedback loops comprises an energy feedback loop 38 for energy regulation. Each respective feedback loop 36, 38 can perform various filtering and scaling operations of the signals 34 output by sensors 32. Any combination of filtering and sampling functions may be used to adapt the signals for the requisite analysis and feedback control.

With respect to power feedback loop 36, power feedback loop includes a filter module 40. Filter module 40 carries out a filtering operation defined by the transfer function $G_P(X, Y)$, which is a transfer function associated with filtering sensor signals 34 to output filtered sensor signals for use in power feedback loop 36, where the subscript P indicates a value related to power. Filter module 40 generates transformed signals $X_P'$ and $Y_P'$, respectively. The transformed signals $X_P'$ and $Y_P'$ are input to a scaling module 42 which conditions the transformed signals by a scalar value $K_P$ for feedback to power control module 46 via summing junction 48 to generate a power feedback error signal $e_{fb}^P$. The power feedback error signal $e_{fb}^P$ is input to power control module 46. Power control module 46 applies a transfer function $D_{fb(2)}^P$ to the error to generate a power control signal $u_{fb}^P$. Power control signal $u_{fb}^P$ is input to energy control module 58, which will be described in greater detail herein. It should be noted that the signals described here and may be implemented as a single signal or as a set of signals. By way of non-limiting example, power control signal $u_{fb}^P$ may be implemented as a single command or a set of commands, as some RF generators have a single actuator, such as for controlling rail voltage or phase, while other RF generators have multiple actuators, such as for a drive and rail voltage.

Feedback loop 30 also includes inner or energy feedback loop 38. Energy feedback loop 38 includes a filter module 52. Filter module 52 carries out a filtering operation defined by the transfer function $G_E(X, Y)$, which is a transfer function associated with filtering sensor signals 34 to output filtered sensor signals for use in energy feedback loop 38, where the subscript E indicates a value related to energy. It will be understood by one skilled in the art that in various embodiments, the transfer function performed by filter module 52 can be commonly shared with the transfer function performed by filter module 40. Filter module 52 generates transformed signals $X_E'$ and $Y_E'$, respectively. The transformed signals $X_E'$ and $Y_E'$, are input to a power determination module 54 that determines a power signal in accordance with the dot product $\langle X_e', Y_e' \rangle$. As will be described in greater detail herein, power determination module 54 generates power measurements for contiguous and non-overlapping blocks. Power determination module 54 outputs a power signal to scaling module 56. Scaling module 56 conditions the transformed signals by a scalar value $K_E$ for feedback to energy control module 58 via summing junction 60. Scaling module 56 applies a scaling factor and a time differential to the output of power determination module 54 to generate energy signal E(b) applied to summing junction 60.

Figure 2:
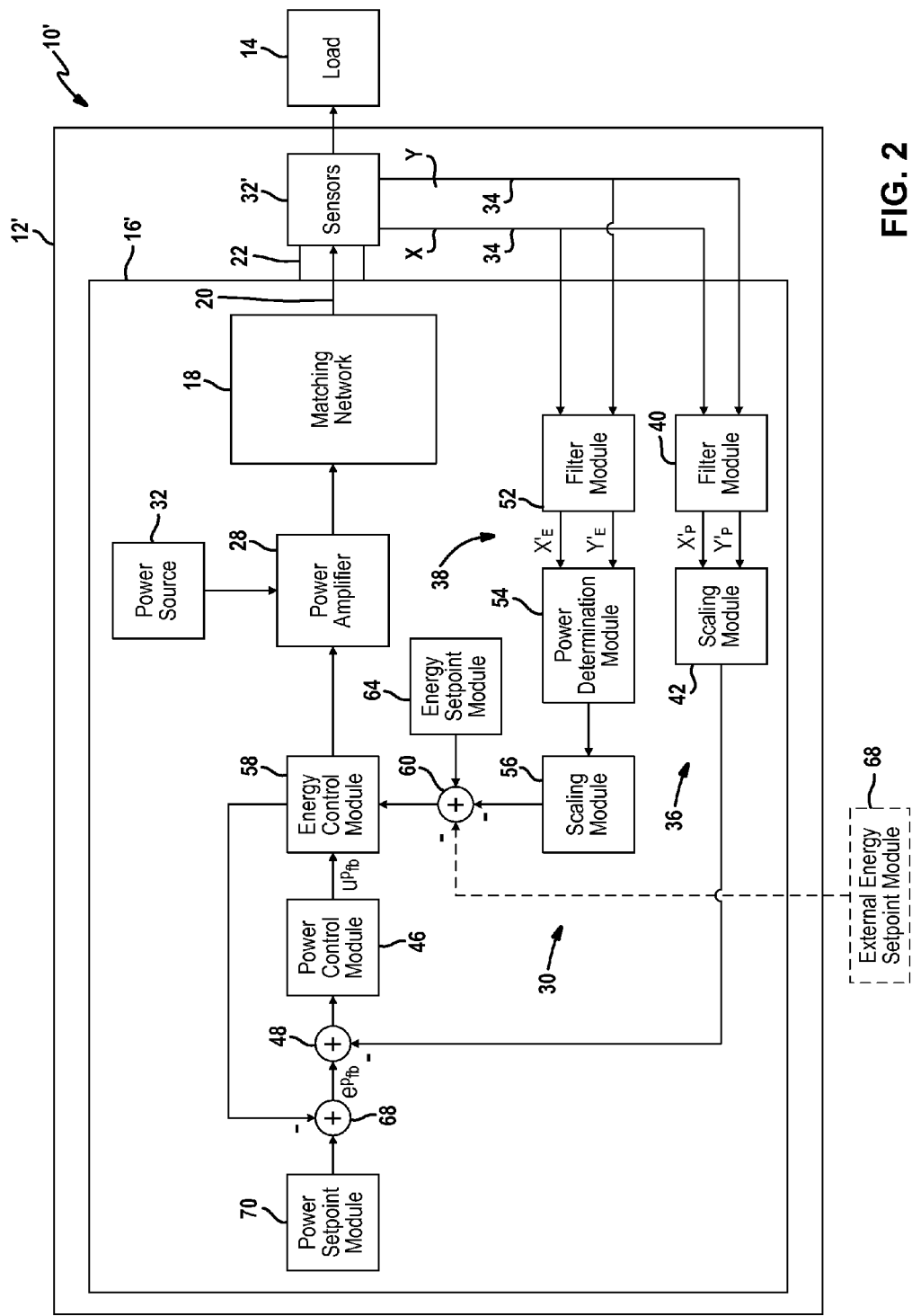
FIG. 2 is a functional block diagram of a RF power delivery system arranged in accordance with the principles of the present disclosure.

Summing junction 60 receives the energy signal E(b) and also receives an energy value from energy measurement module 64. In various embodiments, summing junction 60 also receives an external energy value from an external energy measurement module 67. The external energy measurement value in various embodiments can, by way of nonlimiting example, be generated by an external sensor providing either forward/reverse power information or voltage/current information. The external energy measurement value can be provided by a RF sensor positioned between the matching network and plasma chamber, such as shown in FIG. 2. Energy measured at the input to the plasma chamber is more representative of energy delivered to the plasma chamber in various embodiments. An external energy source could produce the energy-based measurement as described herein where the post-match RF sensor could be coupled to the RF power supply, and the energy computed locally. Post-match energy measurements can be introduced to replace or supplement energy measurements from the power supply local sensor.

Summing junction 60 outputs an energy feedback error signal $e_{fb}^E$. The energy feedback error signal $e_{fb}^E$ is input to energy control module 58. Energy control module 58 receives the energy feedback error signal $e_{fb}^E$ and also receives the power update control signal $e_{fb}^P$. Energy control module 58 applies a transfer function $D_{fb(2)}^P$ and generates a control signal $u_{fb}^{PE}$ to power amplifier 28 to control the output from power amplifier 28 output to load 14. Energy control module 58 thus generates a control signal $u_{fb}^{PE}$ which includes both power and energy adjustments in accordance with the respective power error signal and an energy error signal. Energy control module 58 adjusts the output of the power amplifier 28 by updating actuators coupled to the power amplifier. Energy feedback loop 38 provides a first control mechanism for energy control module 58 to provide controlled by varying the energy duration.

Energy control module 58 also outputs a feedback or power signal set point Cp correction to summing junction 68. Summing junction 68 also receives an external power setpoint signal output by power setpoint module 70, which may be a component of an external controller (not shown). Feedback to summing junction 68 enables an adjustment of the energy amplitude to compensate for energy delivery to provide a second control mechanism in addition to the first control mechanism of energy duration. By way of nonlimiting example, energy control module 58 enables amplitude adjustment of the power setpoint to achieve the desired energy. Such a control mechanism requires interaction with the power regulation. This feedback also prevents any updates to the power amplitude defined by the output of setpoint module 70 from being negated by the power controller.

FIG. 2 depicts a functional block diagram of a RF power system 10'. RF power system 10' of FIG. 2 is configured similarly to FIG. 1. In FIG. 2, sensors 32 of FIG. 1 have been moved outside of RF power generator and control system 16 to the location of sensors 32' of FIG. 2. Sensors 32' output analogous signals X and Y as described in connection with FIG. 1.

Figure 3:
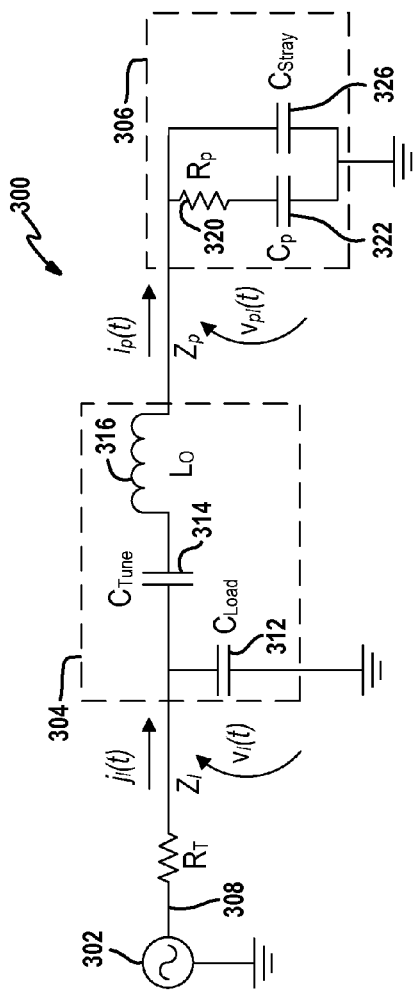
FIG. 3 is a schematic diagram of a model of a RF plasma system.

One feature of the above described FIGS. 1 and 2 is the use of energy feedback for adjusting the output of power amplifier 28. In order to describe this concept in detail, FIG. 3 presents a generalized model of a plasma system in order to describe this concept in detail. The plasma system of FIG. 3 depicts a generalized plasma system 300 including a RF power supply 302, a matching network 304, and a plasma chamber 306.

RF power supply 302 generates a sinusoidal output signal to plasma chamber 306 via transmission line 308 having a resistance $R_T$ 330 and matching network 304. Matching network 304 is modeled as a tunable load capacitance $C_{LOAD}$ 312 shorted to ground, a tunable series capacitance $C_{TUNE}$ 314 in series with transmission line 308 and output inductance $L_O$ 316. Current flowing into matching network 304 is shown as $i_I(t)$, voltage circulating through matching network 304 is indicated as $v_I(t)$, and the impedance of matching network 304 is shown as $Z_I$. Plasma chamber 306 is modeled as a real resistive load $R_P$ 320 in series with a reactive element, parasitic capacitance $C_P$ 322. The series combination of resistive load $R_P$ 320 and parasitic capacitance $C_P$ 322 is placed in parallel with reactive stray capacitance $C_{STRAY}$ 326. Current flowing into plasma chamber 306 is shown as $i_p(t)$, voltage circulating through plasma chamber 306 is indicated as $v_p(t)$, and the impedance of plasma chamber 306 is shown as $Z_p$.

RF power supply 302 operates at a frequency ω within a bandwidth Δω. For optimal power transfer, the impedance $Z_p$ of the plasma chamber 306 is transformed to match the impedance $R_T$ 330 of transmission line 308. Matching network 304 thus transforms the impedance of the plasma chamber to the impedance $Z_I$ of transmission line 308. When this occurs in the lossless case, all power from RF power supply 302 is delivered to matching network 304. The power from matching network 304 is then coupled to plasma chamber 306.

In the case of continuous wave operation of RF power supply 302, the voltage and current supplied to plasma chamber 306 can be represented with the following equations:

$$v_P(t) = V_P \cos(\omega t) \tag{1}$$

$$i_P(t) = I_P \cos(\omega t + \theta) \tag{2}$$

Where θ is the phase angle of the impedance $Z_p$. Similarly, the voltage and current signals of the input of matching network 304 can be represented with the following equations:

$$v_I(t) = V_I \cos(\omega t) \qquad (3)$$

$$i_p(t) = I_I \cos(\omega t + \emptyset) \qquad (4)$$

Where $\emptyset$ is the phase angle of the transmission line impedance $Z_I$.

For continuous wave signals, the power and energy of the RF signals can be derived from the matching network 304 and the plasma chamber 306. The time average power absorbed by the matching network 304 and plasma chamber 306 are respectively defined by the following integrals:

$$P_I = \frac{1}{T} \int_0^{T=\frac{2\pi}{\omega}} v_I(t) i_I(t) dt \qquad (5)$$

$$P_p = \frac{1}{T} \int_0^{T=\frac{2\pi}{\omega}} v_p(t) i_p(t) dt \qquad (6)$$

From equations (5) and (6), the energy can be determined from the time integrals of the corresponding instantaneous power.

$$E_I = \int_0^{T=\frac{2\pi}{\omega}} v_I(t) i_I(t) dt \qquad (7)$$

$$E_p = \int_0^{T=\frac{2\pi}{\omega}} v_p(t) i_p(t) dt \qquad (8)$$

Based on the efficiency of the impedance transformation of the matching network, the power loss of the match is minimized and $P_I = P_p$.

In a typical matching network, physical limitations in the matching network prevent achieving a lossless transfer in the RF power delivery system. The power loss is represented as a scalar ($\alpha \le 1$) of its input power, $P_I = \alpha P_p$. The loss in the match affects the instantaneous power and subsequently the energy computation such that $E_I \ne E_p$. However, these quantities are related analogously to pre-match and post-match power.

The analytical expressions for pulsed mode operation of plasma system 300 will be described in the generalized context of continuous wave describing functions of the power delivery system for the plasma. The effectiveness of sampling power at the input of the matching network will be demonstrated, indicating logistical convenience provided by such sampling. Such a system is indicated in FIG. 1. FIG. 2, however, indicates yet another, desirable location for sampling power, namely, that the output of the matching network. Sampling the output power of the match network, as indicated in FIG. 2, provides direct measurement of the energy delivered to the plasma source in the variation of the matching network and its loss does not impair the relative accuracy.

Figure 4:
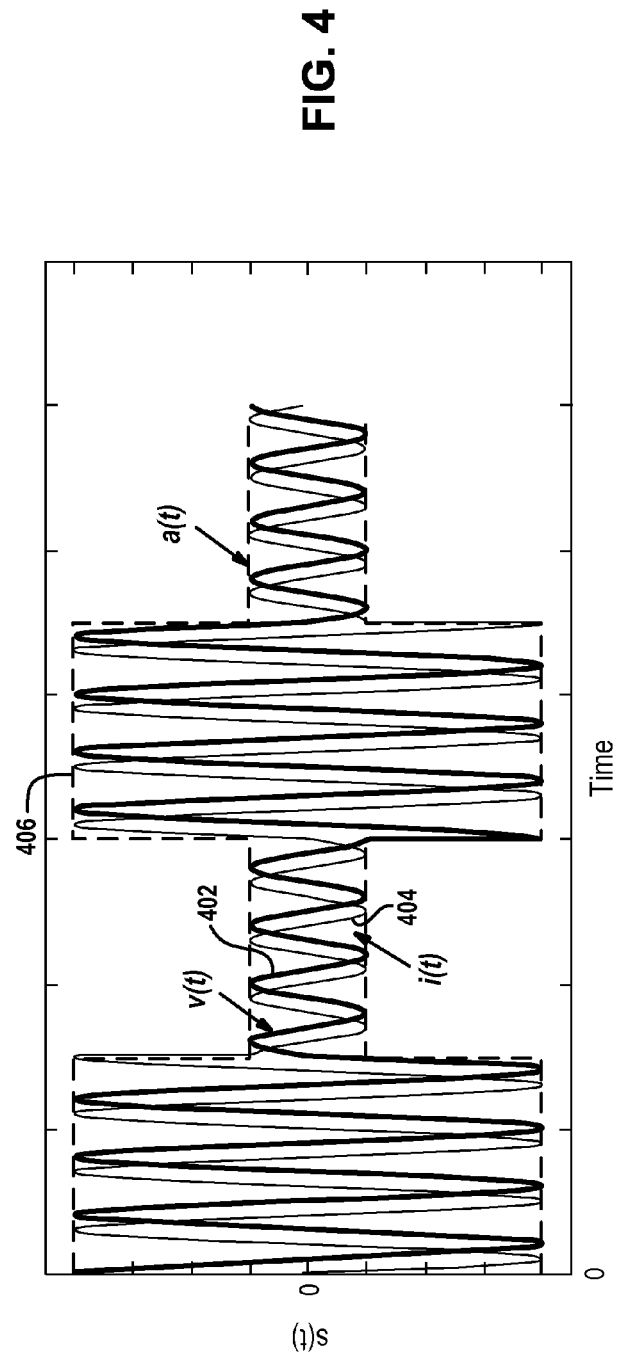
FIG. 4 is a plot of an example bi-level pulsing signal.

FIG. 4 illustrates a waveform depicting an arbitrary, generalized example of a bi-level pulsing signal s(t). The signal s(t) generally represents a power signal that results from bi-level pulsing the RF signal. With reference to FIG. 3, the pulsing signal s(t) is shown as a composite of a modulation signal modulating the voltage and current signals. FIG. 3 thus depicts a voltage signal v(t) 402, a current signal i(t) 404, and a modulating signal a(t) 406. The voltage, current, and modulating signals can be implemented either in analog or digital domains. The signals will be represented generally as described above without specific reference to whether the signals are implemented in the analog or digital domain. Further, the voltage signal v(t) and current signal i(t) represent either the pre-match network or post match network voltage and current expressions discussed above with respect to FIG. 3. In the nonlimiting example of FIG. 3, modulation signal a(t) represents a bi-level pulsing signal. It will be recognized by one skilled in the art that power signal s(t) can result from any form of a modulation function a(t). By way of nonlimiting example, such modulation functions can include linear, time-varying, exponential modulation functions, or combination thereof. In various embodiments, modulation signal a(t) varies relatively slowly with respect to the rapid variation exhibited by the voltage signal v(t) and current signal i(t). In various embodiments, voltage signal v(t) and current signal i(t) are also narrowband signals with respect to the frequency ω and the bandwidth Δω.

In the case of pulsed mode operation, the equation for energy differs from the energy equations described above with respect to equations (7) and (8). The energy equation can be described as shown below:

$$E = \frac{1}{2} \int_{-\infty}^{\infty} |a(t)|^2 dt + \frac{1}{2} \int_{-\infty}^{\infty} |a(t)|^2 v(t) i(t) dt \qquad (9)$$

The above equation (9) is a generalized version which, for the purpose of the discussions herein, should be considered as applying to both FIGS. 1 and 2 which show the sensors 32 before and after matching network 18, respectively.

With particular reference to FIG. 4, FIG. 4 represents an illustration of the second term in equation (9). This integral of equation (9) encompasses the portion of the net area under the product of the voltage v(t) and current i(t) cosine functions modulated by the modulating function a(t). Because the modulation function a(t) varies relatively slowly compared to the cosine functions v(t) and i(t), the net area contributed by the second term of equation (9) is small in comparison to the first-term of equation (9). This result enables the sampling of voltage v(t) and current i(t) signals within the periodic envelopes of the modulation function a(t) to determine the delivered RF energy. Thus, by appropriately measuring or estimating power of the period or periods of the modulation function, the energy of the RF signal can be computed through the envelope of a modulation function a(t). The modulation function can be controlled with the feedback of the energy measurement to deliver consistent, repeatable period to period energy delivery for the prescribed pulsing function. Thus, using energy measured or estimated within the pulse period or periods, the modulation function a(t) can be varied in amplitude or time such that the corresponding period to period energy delivered is repeatable. Further yet, this ultimately enables the control of energy delivered in a RF delivery system, and the energy delivery controller can effectively time vary the energy delivered to the load and monitor the delivered energy for comprehensive, autonomous control system.

As is well known, the general objective of a power delivery system is to maximize the power transfer which typically occurs when the forward power $P_{FWD}$ is maximized or the reverse power $P_{FWD}$ is minimized. Equation (10) below describes both of these cases:

$$\max(P_d = |V||I|(\cos(\emptyset)) = \max(P_{FWD}) - \min(P_{PREV}) \qquad (10)$$

As can be seen from equation (10), the maximum of the load power or delivered power $P_d$ for a reactive load occurs when Ø approaches zero. Adjusting the tuning elements in a matching network, such as matching network 18, enables designers to enable Ø to approach zero. In addition, varying the frequency of the RF power supply can be used to further tune to the optimal point of operation since Ø depends upon the reactive impedance, which also becomes a function of frequency.

Through the use of vector calculus, the cosine of two independent variables can be determined in a generalized form:

$$\cos(\theta) = \frac{\langle VI \rangle}{\|V\|_2 \|I\|_2} \tag{11}$$

Substituting this equation into the equation for delivered power, equation (10) above, yields the following equation, which defines delivered power as a function of the dot product of the sampled voltage and sampled current signals:

$$P_d = \langle VI \rangle \tag{12}$$

The response of the delivered power detector can be demonstrated by varying the phase θ in $i_p(t)$ with respect to the constant phase of $v_p(t)$ and sampling the signals to obtain the following dot product:

$$\langle VI \rangle = \Sigma_{n=1}^{N} v_p[n] i_p[n] \tag{13}$$

where N is selected based on a number of samples that correspond to few periods of ω.

Figure 5A:
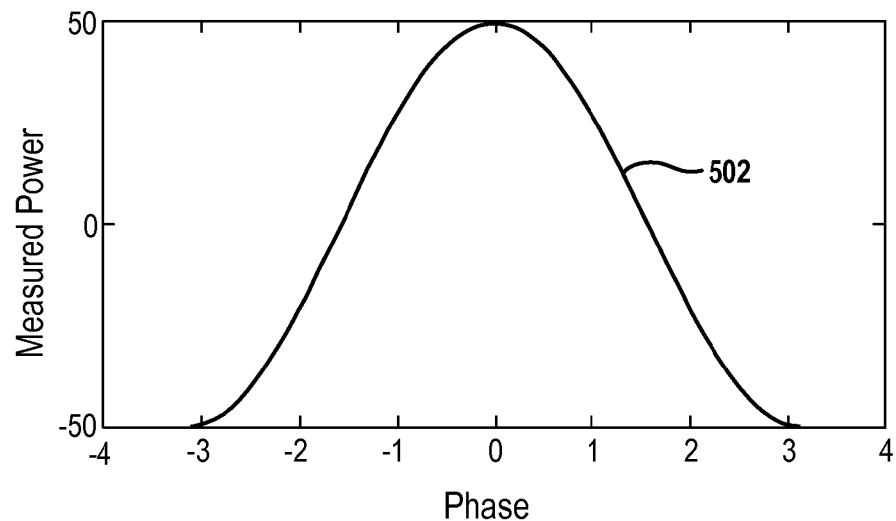
FIGS. 5A and 5B are plots illustrating a relationship between phase and actual power to measured power.
Figure 5B:
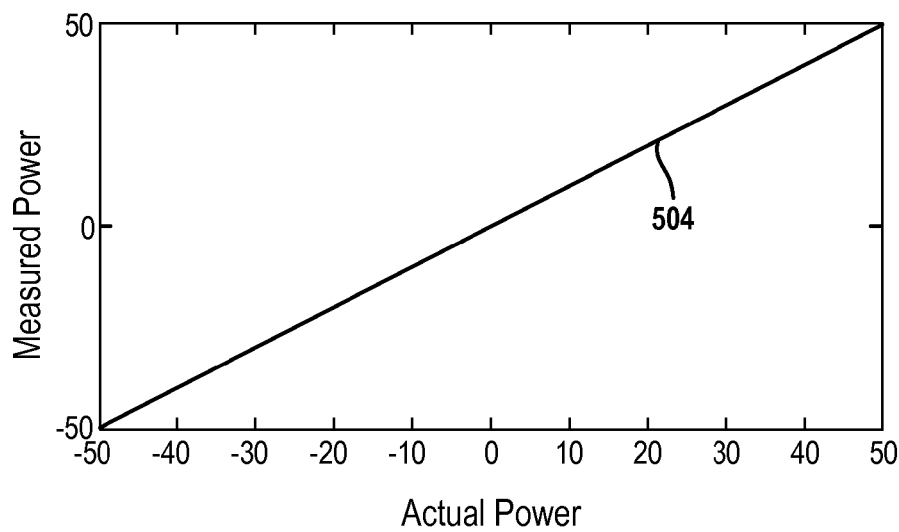

Equation (13) leads to the waveforms of FIG. 5. FIG. 5A depicts a phase response over the phase of ±π. FIG. 5B depicts a linear relationship between the actual power and the measured power. Specifically, FIG. 5A illustrates a waveform 502. The x-axis in FIG. 5A depicts the phase over the period ±π, and the y-axis depicts the measured power. FIG. 5B illustrates a waveform 504. The x-axis in FIG. 5B represents the actual power, and the y-axis represents the measured power.

From FIGS. 5A and 5B, the phase response demonstrates that the need for precise phase measurement is alleviated. Computing the dot product of the voltage v(t) and current i(t) vectors yields a power measurement without deriving the corresponding phase difference of these quantities. This significantly simplifies determining a power measurement in the pulsed mode of operation. Further, the dot product of equation (13) yields the power delivered to the load, as is desired for energy computation. While this could have been accomplished with the forward and reverse ports from a directional coupler, such an approach requires an intermediate step of computing the difference between the forward power and reverse power. Such an intermediate step would increase the loop time for the determination.

Figure 6:
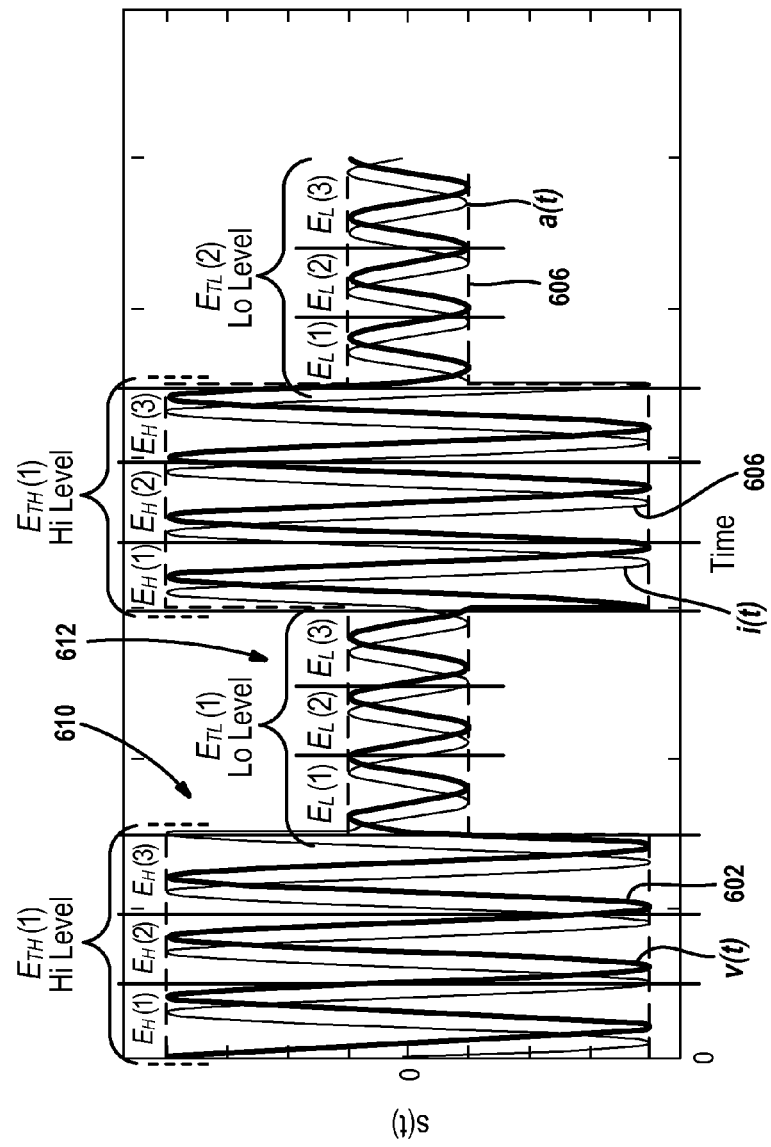
FIG. 6 is a plot illustrating an example bi-level pulsing signal subdivided in two blocks in order to measure the energy contained within each block.

With reference to FIG. 6, in order to compute energy, power is measured in non-overlapping blocks. Similarly to FIG. 4, FIG. 6 illustrates a waveform depicting an arbitrary, generalized example of a bi-level pulsing signal s(t). The signal s(t) generally represents a power signal that results from bi-level pulsing the RF signal. The pulsing signal s(t) is generally shown as a composite of a modulation signal a(t) modulating the voltage signal v(t) and current signal i(t). FIG. 6 thus depicts a voltage signal v(t) 602, a current signal i(t) 604, and a modulating signal a(t) 606.

As described above, the voltage, current, and modulating signals can be implemented either in analog or digital domain. The signals will be represented generally as described above without specific reference to whether the signals are implemented in the analog or digital domain. Further, the voltage signal v(t) and current signal i(t) represent either the pre-match network or post match network voltage and current expressions discussed above with respect to FIG. 3. In the nonlimiting example of FIG. 6, modulation signal a(t) represents a bi-level pulsing signal. It will be recognized by one skilled in the art that power signal s(t) can result from any form of a modulation function. By way of nonlimiting example, such modulation functions can include linear, time-varying, exponential modulation functions, or various combinations thereof. In various embodiments, modulation signal a(t) varies relatively slowly with respect to the rapid variation exhibited by the voltage signal v(t) and current signal i(t). In various embodiments, voltage signal v(t) and current signal i(t) are narrowband signals with respect to the frequency ω and the bandwidth Δω.

Further with respect to FIG. 6, the waveform s(t) is divided into blocks by subdividing the modulation signal a(t). The modulation signal a(t) has a high portion 610 and a low portion 612. High and low portions 610, 612 repeat periodically in accordance with the periodic variation of the modulation signal a(t). Each high portion 610 is divided into three equal time periods $E_H(1)$, $E_H(2)$, $E_H(3)$. Similarly, each low portion 612 is divided into three equal time periods $E_L(1)$, $E_L(2)$, $E_L(3)$. Each respective high portion 610 is referred to as $E_{TH}(1)$, $E_{TH}(2)$, $E_{TH}(3)$, . . . , $E_{TH}(N)$. Likewise, each respective low portion 612 is referred to as $E_{TL}(1)$, $E_{TL}(2)$, $E_{TL}(3)$, . . . , $E_{TL}(N)$. One skilled in the art will recognize that the respective high portions 610 and low portions 612 can be divided in accordance with various design considerations. The selection of dividing each respective high portion 610 and low portion 612 into three blocks of equal time is merely by way of non-limiting example. Further, one skilled in the art will recognize that a high portion 610 can be divided into a number of blocks that differ from the number of blocks into which a low portion 612 is divided.

In order to compute energy, power is derived from samples of voltage and current signals within the frequency $\omega_{RF}$ sampled at a rate of $\omega_s$. Each block contains approximately k periods of $\omega_{RF}$ to define the number of samples per block:

$$k \frac{\omega_s}{\omega_{RF}} \tag{14}$$

and having a time duration of $\Delta t = k \omega_s$. It should be noted that for energy computation, the number of periods k need not be evenly divisible by $\omega_{RF}$ so long as the blocks for a power computation are contiguous and non-overlapping. Energy for each block is in computed as shown in Equation (15) below:

$$E(b) = P_d(b) \Delta t \tag{15}$$

where $P_d(b)$ is defined as the delivered power for a particular block. The total energy for a period of interest can be written:

$$E_{TOTAL} = \Sigma_{\forall b} E(b) \tag{16}$$

and represents accumulation across the energy blocks.

The accumulation across energy blocks can occur in several different manners. For the case of the waveform shown in FIG. 6, the pulsed sequence includes a high portion 610 and a low portion 612, and an energy computation can be carried out for each respective portion. In various embodiments, the modulation function a(t) can be partitioned to determine energy at critical regions and need not be partitioned into equal portions as shown in FIG. 6. By way of example, with respect to FIG. 6, the energy for a particular block is determined as the product of the power block $P_d(b)$, and the time duration of the block $\Delta t$, so that the energy for a particular block is determined in accordance with equation (15). Energy for a high-portion 610 is computed in the general case as follows:

$$E_{TH} = \Sigma_{b=1}^{N} E_N(b) \qquad (17)$$

Energy for the high portion 610 as shown in FIG. 6 is computed for the specific case as:

$$E_{TH} = \Sigma_{b=1}^{3} E_N(b) \qquad (18)$$

Likewise, energy for a low portion 612 is computed in the general case as:

$$E_{TL} = \Sigma_{b=1}^{N} E_N(b) \qquad (19)$$

Energy for the high portion 610 is computed for the specific case as follows:

$$E_{TL} = \Sigma_{b=1}^{3} E_N(b) \qquad (20)$$

The energy computation process described above with respect to equations (17)-(20) is repeated for each various potential level of the pulse sequence for all the subsequent pulse sequences.

The above example described with respect to FIGS. 3-6 provides many important uses for the energy computation. For example, each high portion 610 can be controlled for repeatable high-pulse to high-pulse operation. This enables minimizing the difference between energies in successive pulses, $E_{TH}(j)$ and $E_{TH}(j-1)$. Similarly, each low portion 612 can be controlled for repeatable low-pulse to low-pulse operation. This enables minimizing the difference between energies in successive pulses, $E_{TL}(j)$ and $E_{TL}(j-1)$. The control objectives and utilities for minimizing the different energies between successive pulses for both high portions 610 and low portions 612 can be shared for efficiency of computation. Further, energy differences between high portions 610 and low level portions 612 can be maintained within a modulation function. By way of non-limiting example, the control function would regulate the energy difference between levels using the following equation:

$$E(t) = f(E_{TL}, E_{TH}) \qquad (21)$$

In some instances, a plasma process may require a peak energy block to occur in, for example, a middle section of each level. In this instance, the rectangular modulation function a(t) could be adjusted from the box-car shape shown in FIGS. 4 and 6 to one of various shapes, such as a triangular shape. In various embodiments, a triangular function can be arranged for each level so that a peak occurs in a predetermined portion of each level. For example, if it is desired for a peak to occur in the middle of a three block level, such an implementation could yield the following equation:

$$E_x(2) = \max(E_x(b)) \forall b \qquad (22)$$

The adjacent energy blocks to this peak block would be proportionately lower to achieve the desired peak effect for a predetermined block of a predetermined section.

As discussed above, energy feedback loop 38 provides a first control mechanism for energy control module 58 to provide controlled by varying the energy duration. By way of example with respect to FIG. 6, the bi-level modulation signal a(t) includes a high portion 610 and a low portion 612, where each portion enables a 50% duty cycle for modulation signal a(t). The duration of either the high portion 610 or the low portion 612 can vary as necessary to yield a desired energy value delivered to the load 14. By way of non-limiting example, high portion 610 can be adjusted to deliver a predetermined energy value before transition to the success of portion, low portion 612 in this example. Thus, varying the duty cycle of the modulation function a(t) can be viewed as a duty cycle adjuster that varies the respective high portion 610 and low portion 612, while the overall time of modulation function a(t) remains relatively constant.

With reference to FIGS. 1 and 2, the calibration factor $K_E$ can be determined using various procedures. In various embodiments, for calibration of power computed by the dot product, a least-squares estimate approach may be used. For continuous wave operation, measurement of the power block is periodically stationary in a WSS. For this process, the measured power blocks $P_d^j(b)$ can be acquired for l levels of power by uniform intervals that are distributed over the entire power range of the RF power supply. These measured blocks would correspond to NIST traceable measurements P(l) and calibration factor would be determined as follows:

$$\overline{K}_E = \frac{\sum P_d^j(b) P(l)}{\sum P_d^j(b)^2} \forall l \qquad (23)$$

The order of the least square estimator could be increased if necessary to compensate for any systemic offset. To convert the energy per block (in Joules) as a unit of measure, the calibration factor is scaled by block duration, that is:

$$\overline{K}_E = \Delta t \overline{K}_E \qquad (24)$$

Which yields the calibration constant described above.

The concepts discussed above with respect to FIGS. 3-6 also enable, in various embodiments, a time-varying modulation function. By way of nonlimiting example, the primary modulation function a(t) repeats from a high and low level sequence. The energy block sequence could be greater than or less than the individual high and low-level sequences. This enables effective application of a secondary modulation function b(t) applied to the first repeated sequence. The secondary modulation function b(t) effectively adjusts the primary modulation function a(t) so that subsequent energy block sequence could be greater or less than the high portions 610 or low portions 612 that result from modulation only by the primary modulation function a(t). The power function would then appear as follows:

$$s(t) = a(t) b(t) \qquad (23)$$

Such time variation can yield a variety of configurations in accordance with the configuration of the primary modulation function a(t) and the secondary modulation function b(t) and the product of the same. Secondary function b(t) can have a share or form of any of a number of modulation functions, including, but not limited to, square, sinusoidal, sawtooth, exponential, Gaussian, or any combination thereof.

Figure 7A:
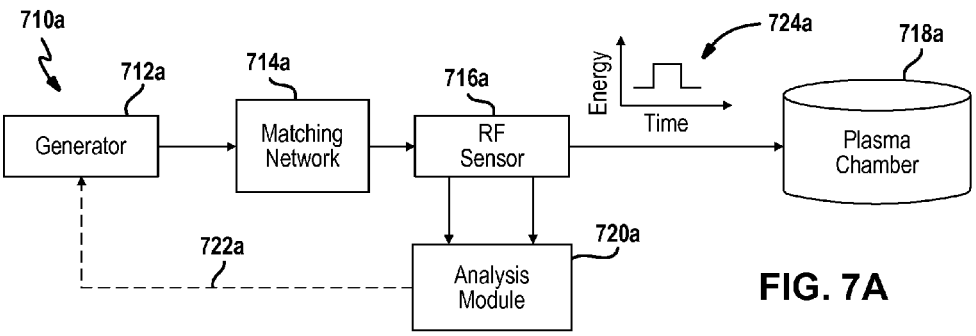
FIGS. 7A-7C are functional block diagrams of RF delivery systems having single and multiple RF generators.

Because the energy control schemes discussed above provide a much more accurate depiction of the plasma process and do so in a much improved, timely fashion, the schemes lend themselves to a much improved RF power delivery system. These systems include single and multiple generator systems and facilitate independent ion energy and ion flux control. With reference to FIG. 7, FIG. 7A depicts a plasma delivery system 710a having conventionally arrange components operating using the energy based control of the RF power delivery system described above. Power delivery system 710a includes a RF generator module 712a which generates an RF signal to matching network 714a. Matching network 714a operates conventionally as described above and generates a matched RF drive signal to a plasma chamber 718a via RF sensor 716a. As described above, RF sensor 716a outputs a signal or signals to analysis module 720a. RF generator 712a executes the energy base control approach described above. Analysis module 720a generates an external control signal 722a to RF generator 712a. The output to plasma chamber 718a is generated using the energy based control approach described above. FIG. 7A, thus includes a RF signal having an energy value that varies in accordance with time as shown by plot 724a.

Figure 7B:
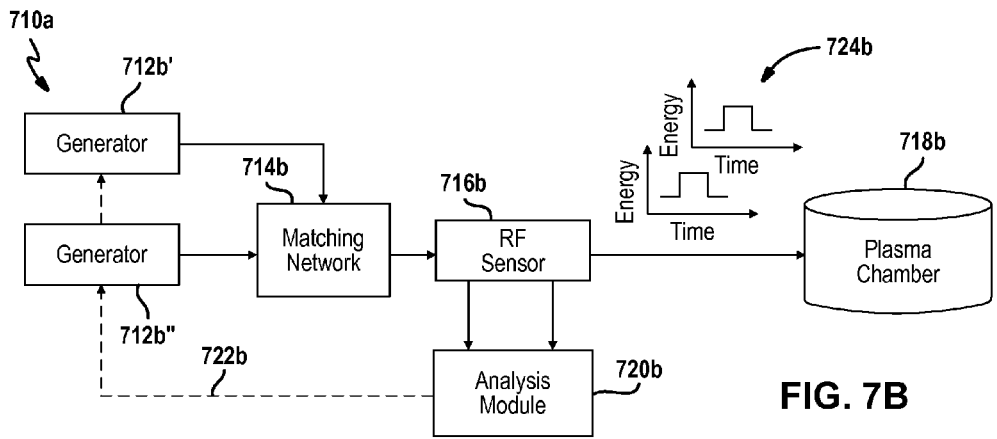

FIG. 7B is arranged similarly to FIG. 7A, but also includes a pair of RF generators 712b', 712b'', each generating respective RF output signals input to matching network 714b. In the various embodiments shown in FIG. 7B, RF generators 712b', 712b'' use an energy based control system for generating the respective output signals. The multiple RF power supply arrangement of FIG. 7B, may be applicable where plasma systems provide the process with the ability to independently control ion energy and ion flux. Plots 724b of FIG. 7B indicate that the RF signals output by RF generators 712b', 712b'' cooperate to form a signal input to plasma chamber 718b. While the signal input to plasma chamber 718b is a composite signal of the output of RF generators 712b', 712b'', the plot 724b indicates a variation of energy with respect to time for each of the signals. In the various embodiments described in FIG. 7B, energy related to the ion energy and ion flux can be independently measured and controlled for process keep ability in order to enable expansion of the functionality of RF plasma delivery systems in the future.

Figure 7C:
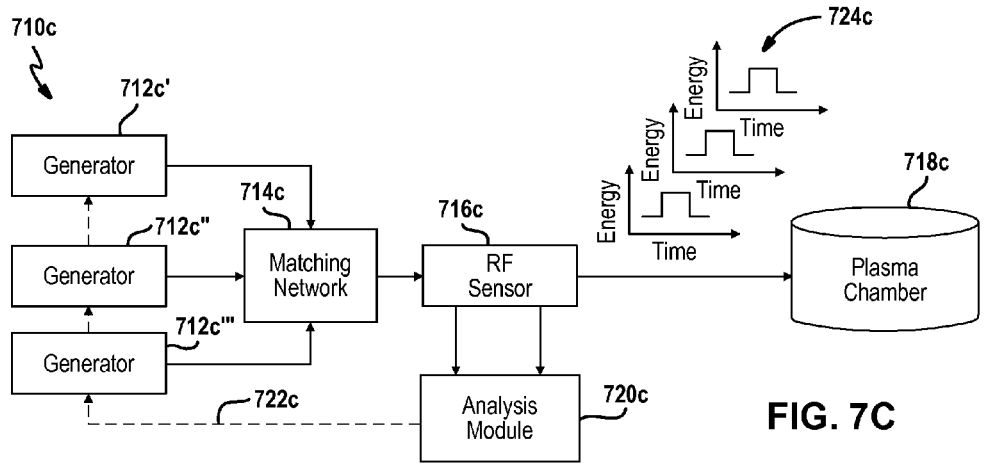

FIG. 7C is arranged similarly to FIGS. 7A and 7B, but includes a trio of RF generators 712b', 712b'', 712c''', each generating respective RF output signals input to matching network 714c. In the various embodiments shown in FIG. 7C, RF generators 712c', 712c'', 712c''', an energy based control system for generating their respective RF signals. The multiple RF power supply arrangement of FIG. 7C, may be applicable where plasma systems enhance actual energy distribution of ions incident on the surface of a material. Plots 724c of FIG. 7C indicate that the RF signals output by RF generators 712b', 712b'', 712c'''' cooperate to form a signal input to plasma chamber 718c. While the signal input to plasma chamber 718c is a composite signal of the output of RF generators 712c', 712c'', 712c''', the plot 724c indicates a variation of energy with respect to time for each of the signals.

In FIGS. 7A-7C, external power measurement is shown using a dashed line between analysis module 720 back to RF generator 712. The external energy measurement can be used to supplement the internal RF energy measurement taken by RF generator 712, or the external energy measurement can be used to replace the internal energy measurement taken by each respective RF generator 712.

The RF power delivery systems described above enable direct control of a number of process control variables that contribute to the capability of thin-film manufacturing for semiconductor fabrication. As has been discussed in connection with the control mechanisms described above, the energy measurement for amplitude and duration controlled pulse sequences enable one control mechanism. Further from a control perspective, synchronizing multiple RF power sources also enables important control to optimize the coherent delivery of energy as it relates to energy control of the different sources and its corresponding parameters, such as ion energy, ion flux, and ion energy distribution. If RF power supplies are not synchronously controlled within their respective pulse sequences, the benefit of the energy control mechanisms described herein is greatly reduced. Accordingly, the present disclosure is also directed to various control approaches for pulsing RF power.

A first aspect of time synchronization of modulation functions occurs in connection with phase coherency of multiple RF power supplies. Phase coherency of multiple RF power supplies enables the establishment of time synchronization of modulation functions. In order to discuss phase coherency of multiple RF power supplies, we note that the sum of two sinusoidal signals differing in phase but sharing a common frequency produces a sinusoidal signal of the same frequency as demonstrated by the following equation:

$$C \cos(\omega_0 t + \phi) = a \cos \omega_0 t + b \sin \omega_0 t \quad (24)$$

where the magnitude of the function is:

$$C = (a^2 + b^2)^{1/2} \quad (25)$$

and the phase of the function is:

$$\varphi = \tan^{-1}\left(\frac{b}{a}\right) \quad (26)$$

For energy based control systems, a primary interest lies in the variation in the energy function as it relates to the difference in phase for the sum of two sinusoids having the same frequency. The energy is constant for any phase $\phi$ because the energy integral is computed over the period of the signal, namely:

$$\int_0^{T=\frac{2\pi}{\omega_0}} f^2(t)dt \quad (27)$$

Figure 8:
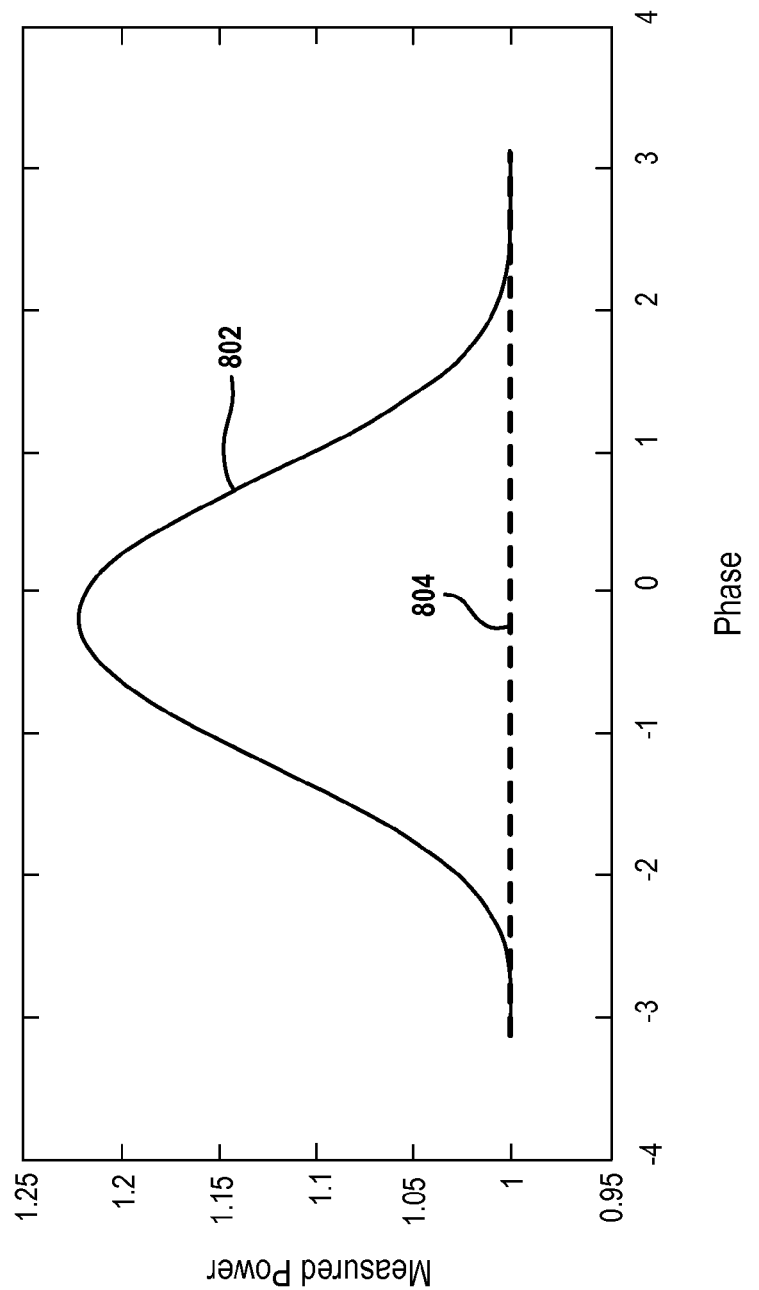
FIG. 8 is a plot illustrating normalized energy for varying the phase for the energy computed over the period of a sinusoidal signal.

For the sum of two sinusoidal signals that differ in frequency, the energy interval also remains constant for any phase variation between the signals. FIG. 8 illustrates a plot of phase along the x-axis versus normalized energy along the y-axis, and provides a visual representation of this concept. Particularly, waveform 802 depicts a phase difference between a pair of sinusoidal signals. Waveform 804 depicts the energy integral based upon the phase difference between the sinusoidal signals. As can be seen in FIG. 8, the energy at waveform 808 remains constant regardless of the phase difference between the two sinusoidal signals.

With respect to energy as it relates to the modulation function, the energy of the modulated signal is a function of the envelope produced by the modulation function. For the sum of two sinusoidal signals, regardless of the relative frequencies, the first energy integrand of equation (9) does not contain the sinusoidal signal, and only contains the modulation function. Thus, the energy interval is invariant to phase change of the sum of the sinusoidal signals because the modulation function is not a harmonic of the sinusoidal function. Rather, the modulation function fluctuates slowly relative to the rapid periodic variation of the sinusoid. The modulation function thus impinges on the sinusoid without discriminating the phase of the sinusoid. The energy integral is taken from the modulation function in various phases of the modulated signal. Waveform 804 of FIG. 8, indicates that the normalized energy of the sum of two sinusoids of differing frequencies varies with respect to the phase when energy is computed with respect to the modulation function.

When the energy is computed with respect to pulse sequencing, the energy in the sinusoid does not remain constant. There are two approaches to address this consideration. One approach is to phase lock multiple RF power supplies within the piece-wise intervals of the modulation when the frequencies of the supplies is the same. An example of such phase locking can be found with respect to U.S. Pat. No. 7,602,127, which is incorporated by reference herein. This further ensures that the pair of power supplies would lock to a certain phase offset as a relates to the modulation function and remain phase locked during certain intervals of the pulse sequence. When the frequency of the power supplies differ it becomes impractical to phase lock between RF power supplies with different operating frequencies. One approach to this is to time synchronize the RF power supplies with the modulation function. Synchronizing the modulation function between the power supplies ensures optimal process conditions for the control plasma parameters and enables the energy feedback scheme described herein to control pulse to pulse regulation of energy.

Figure 9:
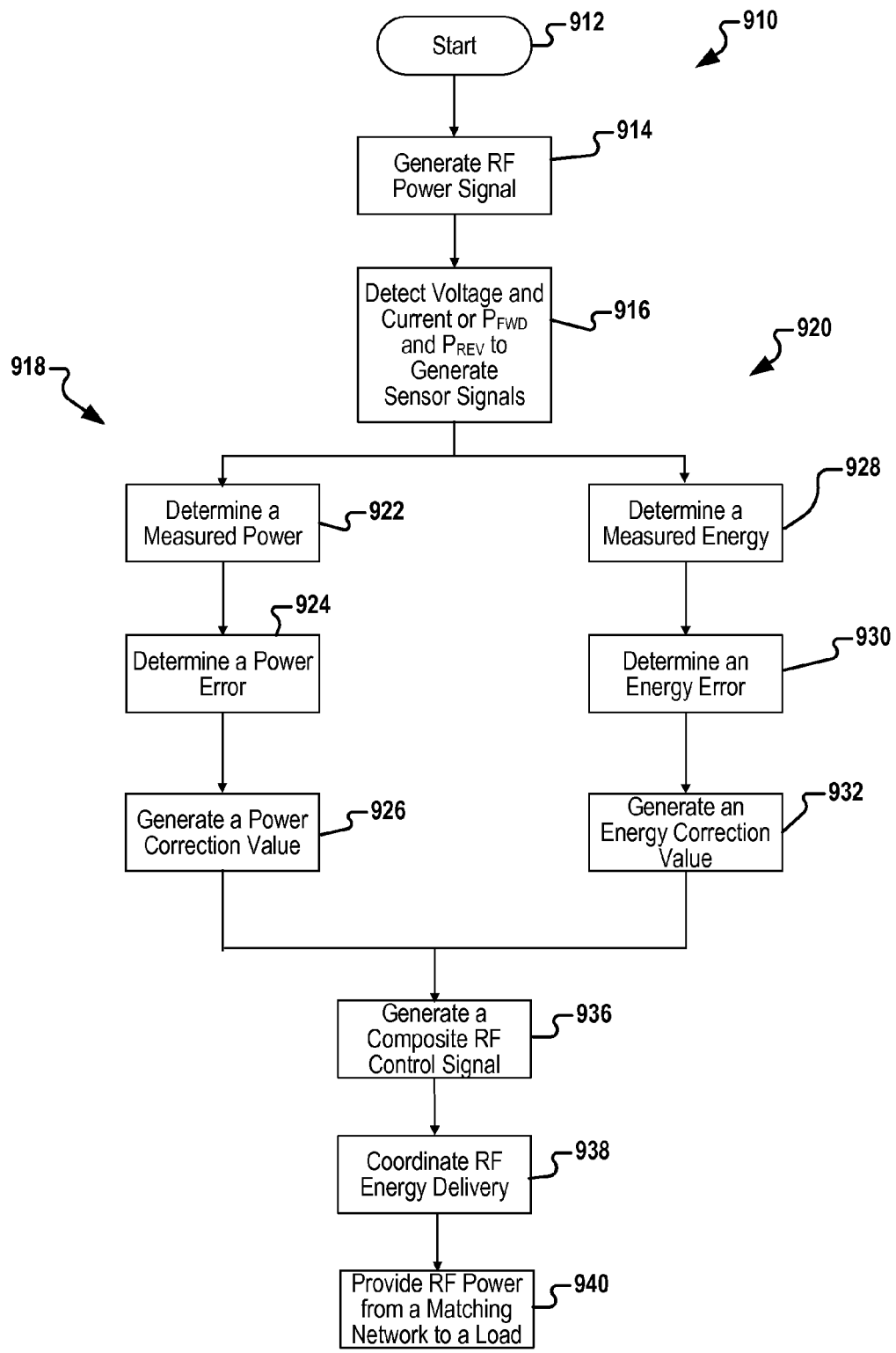
FIG. 9 illustrates an energy control method in accordance with the present disclosure.

With reference to FIG. 9, FIG. 9 illustrates a flowchart for describing a method for implementing a feedback control and coherency system 910 for the delivery of RF power. Control begins at 912 and proceeds to 914 where a RF power signal is generated for output to a load. One skilled in the art will recognize that the RF power signal generated at 914 corresponds the output from power amplifier 28 in FIGS. 1 and 2. Control proceeds to 916 were the RF power signal is measured in order to determine one of a voltage and current or forward and reverse power delivered to the load. Corresponding sensor signals are generated in accordance with measured quantities.

The measured quantities are input to each of a power feedback loop 918 and an energy feedback loop 920. Power feedback loop 918 receives measured quantities from 916 in order to determine a power feedback correction value or values. At 922 of power feedback loop 918, the measured power of the RF signal is determined, as described above. From the measured power, a power error is determined at 924. The power error enables determination of a power correction value or values at 926. The power correction value determined at 926 is used to generate a composite RF control signal at 936.

Energy feedback loop 920 receives the measured quantities from 916 in order to determine an energy feedback correction value or values. And 928 of energy feedback loop 920, the measured energy of the RF signal is determined, as described above. From the measured energy, an energy error is determined at 930. The energy error enables determination of an energy correction value or values at 932. The energy correction value determined at 932 is used in cooperation with the power correction value determined at 926 to generate a composite RF control signal at 936. Thus, the power correction value determined at 926 and the energy correction value determined at 932 are used in combination to generate the composite RF control signal at 936. The term composite is used to refer to a control signal considering both power feedback and energy feedback in order to generate a control signal.

In systems having multiple RF power supplies, such as those shown in FIGS. 7B and 7C, showing two and three power supply systems, respectively, delivery of the RF signals output from multiple RF generators is coordinated at 938. In systems having only one RF power supply, 938 can be omitted from the control system. In systems having more than one RF power supply, the RF signals output from each respective power supply can be coordinated as described above. Namely, the RF energy can be coordinated using phase coherency of multiple RF power supplies. In a non-limiting alternative, coordination of multiple RF power supplies can be implemented using time synchronization of the modulation functions.

Following coordination of the RF energy delivery at 938, where appropriate, RF power is generated from a matching network to a load. The RF power is determined in accordance with both the power feedback and the energy feedback information generated by the respective feedback loops 918, 920. The RF power applied to the load also has been coordinated amongst multiple power supplies, as described in connection with 938.

FIGS. 10-13 illustrate various embodiments for implementing phase coherence in the various embodiments described above. In describing phase coherence in FIGS. 10-13, the modulation signal depicted in the figures will be represented as a square wave. However, it should be understood that phase coherence can be similarly implemented using any of the various modulation signal and RF signal waveforms described above. The various implementations of phase coherence, thus, are not limited to implementation with the square wave modulation signal or sinusoidal RF signal described herein. Further, it should be understood that, by way of nonlimiting example, the square waves described herein need not operate at the same frequency and that phase coherence can be achieved between a pair of modulation signals having different frequencies and for modulation signals whose pulse width and frequency varies between pulses.

Figure 10:
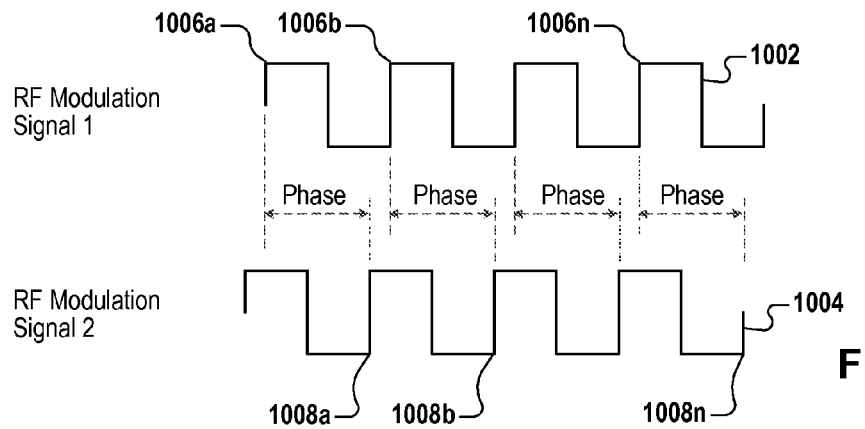
FIG. 10 depicts a pair of waveforms illustrating a phase difference between a pair of modulation signals.

With reference to FIG. 10, FIG. 10 depicts a pair of RF modulation signals 1002, 1004 and illustrates implementing phase coherence between the modulation signals to provide a relative phase. Modulation signals 1002, 1004, by way of nonlimiting example, can be associated with a respective RF generator 712b as is shown in FIG. 7B. In various embodiments, the phase coherence described herein with respect to FIG. 10 can be implemented for more than a pair of RF generators, such as shown in FIG. 7C. RF modulation signal 1 1002 is illustrated as a square wave signal having a series of pulses having rising edges 1006a, 1006b, . . . , 1006n. Similarly, RF modulation signal 2 1004 is illustrated as a square wave signal having a series of pulses having leading edges 1008a, 1008b, . . . , 1008n. The phase difference between the respective RF modulation signals 1002, 1004 is the difference between the respective leading edges 1006a, 1006b, . . . , 1006n of RF modulation signal 1 1002 and 1008a, 1008b, . . . , 1008n of RF modulation signal 2.

Figure 11:
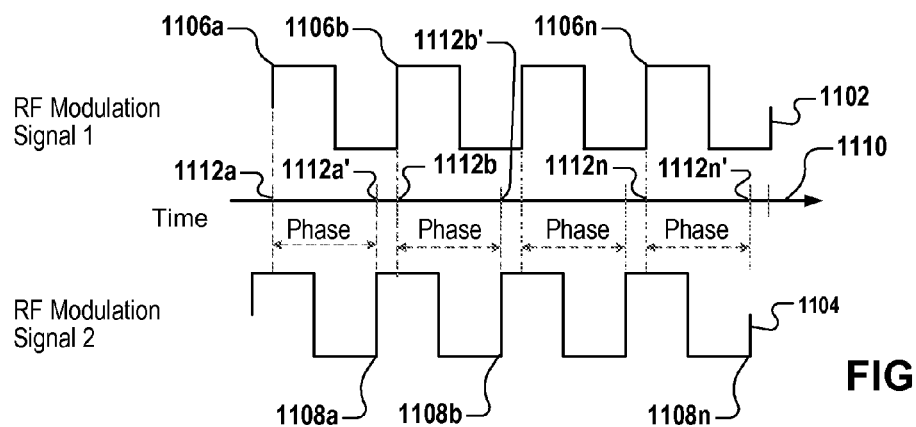
FIG. 11 depicts a pair of waveforms illustrating a phase difference between a pair of modulation signals in accordance with a fixed time pulse.

With reference to FIG. 11, FIG. 11 depicts a pair of RF modulation signals 1102, 1104 implementing phase coherence between the modulation signals relative to a fixed time base. Modulation signals 1102, 1104, by way of nonlimiting example, can be associated with a respective RF generator 712b as is shown in FIG. 7B. In various embodiments, the phase coherence described herein with respect to FIG. 11 can be implemented for more than a pair of RF generators, such as shown in FIG. 7C. RF modulation signal 1 1102 is illustrated as a square wave signal including a series of pulses having leading edges 1106a, 1106b, . . . , 1106n. Similarly, RF modulation signal 2 1004 is illustrated as a square wave signal including a series of pulses having leading edges 1108a, 1108b, . . . , 1108n. FIG. 11 also illustrates a timeline 1110.

The phase difference between the respective RF modulation signals 1102, 1104 is determined with respect to time markers 1112*a*, 1112*b*, . . . , 1112*n* arranged on timeline 1110. The phase is thus defined relative to time markers 1112 on timeline 1110. The phase difference is determined by arranging the respective leading edges of the respective RF modulation signals 1102, 1104 and time markers 1112. As shown in FIG. 11, leading edge 1106*a* of RF modulation signal 1 1102 is aligned with time marker 1112*a*. Leading edge 1108*a* of RF modulation signal 2 1104 is determined relative a time difference from 1112*a*, shown as marker 1112*a*'. Leading edges 1106*b* and 1106*n* of RF modulation signal 1 1102 are similarly arranged with respect to time markers 1112*b* and 1112*n*. Leading edges 1108*b* and 1108*n* of RF modulation signal 2 1104 are similarly arranged with respect to time markers 1112*b*' and 1112*n*', which are a determined time difference from respective time markers 1112*a*, 1112*b*. It should be recognized that the rising edges 1106 and 1108 need not align with respective time markers 1112, 1112'. The phase of each waveform may be arranged relative to respective time markers 1112, 1112'.

Figure 12:
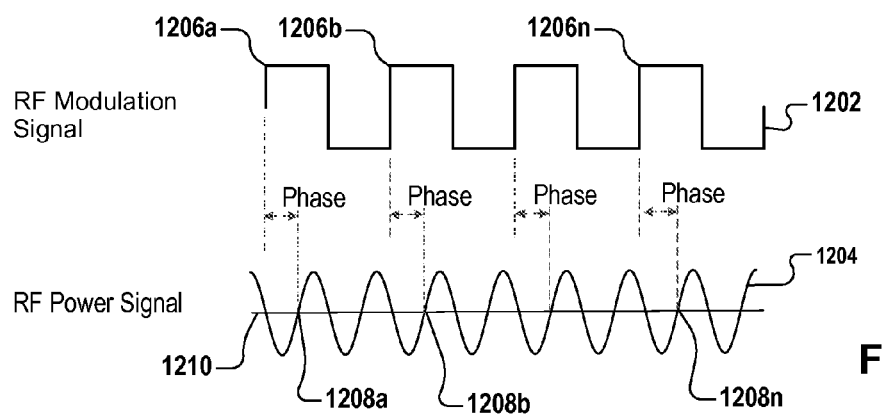
FIG. 12 depicts a modulation signal and its associated power signal and illustrates a phase difference between the two signals.

FIG. 12 depicts another various embodiment for achieving phase coherence in the various embodiments of the subject disclosure. FIG. 12 includes a RF modulation signal 1202 and a RF power signal 1204 modulated by the RF modulation signal 1202. RF modulation signal 1202, by way of nonlimiting example, can be associated with a respective RF generator 712 as is shown in any of FIGS. 7A-7C. RF modulation signal 1202 is illustrated as a square wave signal including a series of pulses having rising edges 1206*a*, 1206*b*, . . . , 1206*n*. RF power signal 1204 is illustrated as a sinusoidal signal. RF power signal 1204 is depicted herein generally as a composite signal of the signals, by way of nonlimiting example, shown in FIGS. 4 and 6 above. It should be recognized that RF power signal 1204 can be embodied as any of the various RF power signals described herein and as our generally known in the art. RF power signal 1204 operates in a sinusoidal manner, and includes a plurality of baseline crossings 1208*a*, 1208*b*, . . . , 1208*n* relative to a baseline 1210.

The phase difference between the respective RF modulation signal 1202 and RF power signal 1204 is the difference between the respective rising edges 1206*a*, 1206*b*, . . . , 1206*n* of RF modulation signal 1202 and baseline crossings 1208*a*, 1208*b*, . . . , 1208*n* of RF modulation signal 1202. The phase coherence described herein with respect to FIG. 12 can be implemented for one or more RF generators, such as any of the single or multiple RF generator configurations shown in FIGS. 7A-7C. Further, the phase coherence discussed in connection with FIG. 12 can also be implemented in addition to the phase coherence discussed in accordance with FIGS. 10 and 11.

Figure 13A:
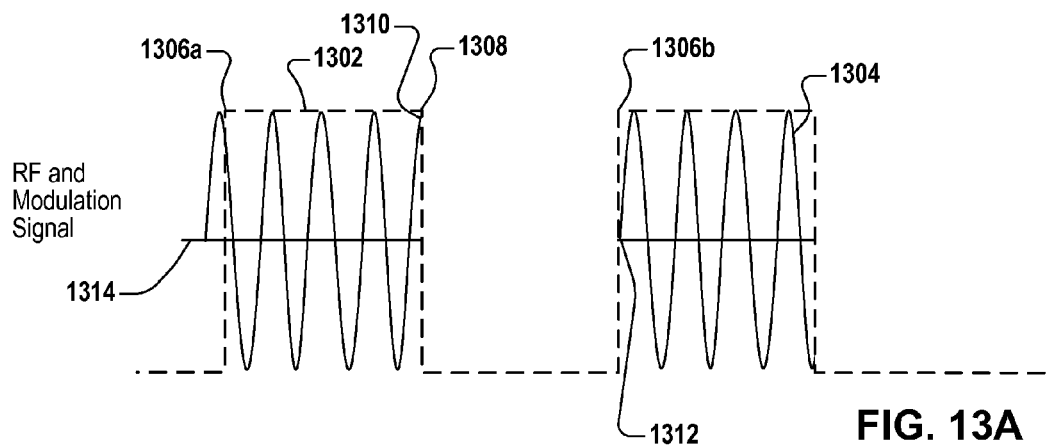
FIGS. 13A-13B each depict a modulation signal and its associated power signal and illustrates various embodiments for initiating the RF signal upon the start of the next pulse sequence of the modulation signal.
Figure 13B:
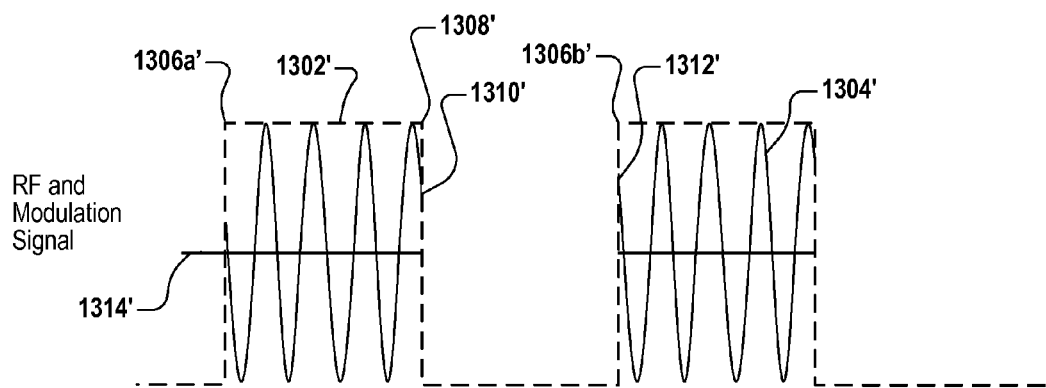

FIG. 13A-13B illustrate yet another aspect of phase coherence, namely, initiation of the RF pulse with respect to the modulation signal at the rising edge of the modulation signal, such as occurs at pulse initiation. FIG. 13A depicts a RF modulation signal 1302 as a square wave signal and depicts RF power signal 1304 as a sinusoidal signal. RF modulation signal 1302 includes rising edges 1306*a* and 1306*b*. FIG. 13 depicts various embodiments of cessation and initiation of RF pulse 1304 at rising edge 1306*b*. As can be seen in FIG. 13A, RF pulse 1304 ceases operation at falling edge 1308 at point 1310. RF pulse 1304 reinitiates along rising edge 1306*b* at point 1312. Thus RF signal 1304 ceases operation abruptly and restarts at a predetermined location, such as a baseline crossing, by way of nonlimiting example.

With reference to FIG. 13B, RF modulation signal 1302' is depicted as a square wave signal and RF power signal 1304' as a sinusoidal signal. RF modulation signal 1302' includes as series of pulses having rising edges 1306*a*' and 1306*b*'. Of particular interest in connection with FIG. 13B is the continuous operation of RF pulse 1304' at falling edge 1308' and rising edge 1306*b*'. As can be seen in FIG. 13B, RF pulse 1304' ceases operation at falling edge 1308' at point 1310'. RF pulse 1304' reinitiates along rising edge 1306*b*' at point 1312', maintaining continuous operation though the pulse transition.

Further with respect to FIGS. 10-13, the phase of the RF signal may commence at a particular frequency when the modulation function pulsing starts. Further, the phase may vary for each pulse sequence based on the termination of the phase at the end of the prior pulse sequence or based on the energy for the previous pulse. Further, at the start of the pulse, such as in a single RF power supply, the phase relationship between each RF signal starts at a desired phase relationship. The phase relationship may be adjusted from one pulse sequence to the next, such as in accordance with the prior pulse.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A radio frequency (RF) control system comprising:
   a power amplifier, the power amplifier generating a RF signal to a load;
   a sensor monitoring the RF signal and generating a sensor signal based on the RF signal;
   an energy detection circuit determining an energy of the RF signal in accordance with the sensor signal;
   a power amplifier energy adjustment circuit, the power amplifier adjustment circuit outputting a control signal for varying the RF signal in accordance with the energy determined by the energy detection circuit,
   wherein the RF signal is one of a pulsed signal or a continuous wave signal.

2. The RF control system of claim 1 further comprising a power detection circuit determining a power of the RF signal in accordance with the sensor signal.

3. The RF control system of claim 2 further comprising a power amplifier power adjustment circuit generating a power compensation signal in accordance with the power determined by the power detection circuit.

4. The RF control system of claim 3 further comprising a power summer circuit receiving and summing and output signal from the power detection circuit and a power setpoint signal, wherein output of the power summer circuit is input to the power adjustment circuit and wherein the power compensation signal varies in accordance with the output of the power summer circuit.

5. The RF control system of claim 2 further comprising an energy summer circuit receiving and summing an output signal from the energy detection circuit and an energy setpoint signal, wherein the output of the energy summer circuit is input to the power amplifier energy adjustment circuit and wherein the control signal from the power amplifier energy adjustment circuit varies in accordance with the output of the energy summer circuit.

6. The RF control system of claim 5 wherein the energy summer circuit receives an external energy measurement signal, wherein the external energy measurement signal varies in accordance with a signal output by a sensor external to the RF control system.

7. The RF control system of claim 6 wherein the sensor external to the RF control system is positioned between a matching network and the load.

8. The RF control system of claim 1 wherein the sensor before a matching network connected to the load.

9. The RF control system of claim 1 wherein if the RF signal is a pulsed signal, the RF signal includes a sinusoidal signal and a modulation signal modulating the sinusoidal signal and wherein the energy detection circuit determines the energy of the modulation signal to determine the energy of the RF signal.

10. The RF signal of claim 9 wherein the energy detection circuit determines the energy of the modulation signal in blocks, wherein each block is a predetermined length of time, and the energy for the RF signal is determined by adding the energy determined for each block.

11. The RF signal of claim 9 wherein the modulation signal has the shape of at least one of a square wave, sawtooth, a sinusoidal signal, or a combination thereof.

12. A radio frequency (RF) control system comprising:
a power amplifier, the power amplifier generating a RF signal to a load;
an energy detection circuit determining an energy of the RF signal in accordance with a sensor signal output by the sensor and based on the RF signal;
a power detection circuit determining a power of the RF signal in accordance with the sensor signal; and
a power amplifier energy adjustment circuit generating a control signal for varying the RF signal in accordance with the energy determined by the energy detection circuit and the power determined by the power detection circuit,
wherein the RF signal includes a first signal and a first modulation signal modulating the first signal and wherein the energy detection circuit determines the energy of the first modulation signal to determine the energy of the RF signal.

13. The RF control system of claim 12 wherein the first modulation signal includes a first characteristic portion and a second characteristic portion.

14. The RF signal of claim 13 wherein the energy detection circuit determines the energy of the first modulation signal in blocks, wherein each block is a predetermined length of time, and the energy for the RF signal is determined by adding the energy determined for each block.

15. The RF signal of claim 14 wherein the first characteristic portion comprises a first number of blocks and wherein the energy determined for the first number of blocks is added to determine the energy for the first characteristic portion.

16. The RF signal of claim 15 wherein the second characteristic portion comprises a second number of blocks and wherein the energy determined for the second number of blocks is added to determine the energy for the second characteristic portion.

17. The RF signal of claim 12 wherein the RF signal further includes a second modulation signal modulating the first modulation signal to define a composite modulation signal, wherein the composite modulation signal modulates the first signal.

18. The RF control system of claim 17 wherein the composite modulation signal includes a first characteristic portion and a second characteristic portion.

19. The RF signal of claim 18 wherein the energy detection circuit determines the energy of the composite modulation signal in blocks, wherein each block is a predetermined length of time, and the energy for the RF signal is determined by adding the energy determined for each block.

20. The RF signal of claim 19 wherein the first characteristic portion comprises a first number of blocks and wherein the energy determined for the first number of blocks is added to determine the energy for the first characteristic portion.

21. The RF signal of claim 20 wherein the second characteristic portion comprises a second number of blocks and wherein the energy determined for the second number of blocks is added to determine the energy for the second characteristic portion.

22. A radio frequency (RF) control system comprising:
a plurality of power amplifiers, each power amplifier generating a respective RF signal to a load, each power amplifier including:
a power amplifier that outputs a RF signal to a load;
an energy detection circuit determining an energy of the RF signal in accordance with a sensor signal that varies in accordance with the RF signal; and
a power amplifier energy adjustment circuit generating a control signal for varying the RF signal in accordance with the energy determined by the energy detection circuit;
a RF delivery coordination module, the RF delivery coordination module controlling the phase between the respective RF power supplies.

23. The RF control system of claim 22 wherein at least one of the plurality of power amplifiers further comprises a power detection circuit determining a power of the respective RF signal in accordance with the respective sensor signal.

24. The RF control system of claim 23 wherein at least one power amplifier further comprises a power amplifier power adjustment circuit generating a power compensation signal in accordance with the power determined by the respective power detection circuit.

25. The RF control system of claim 24 wherein at least one power amplifier further comprises a power summer circuit receiving and summing in output signal from the respective power detection circuit and a power setpoint signal, wherein output of the power summer circuit is input to the respective power adjustment circuit and wherein the respective power compensation signal varies in accordance with the output of the respective power summer circuit.

26. The RF control system of claim 23 wherein at least one power amplifier further comprises an energy summer circuit receiving and summing an output signal from the respective energy detection circuit and an energy setpoint signal, wherein the output of the respective energy summer circuit is input to the respective power amplifier energy adjustment circuit and wherein the control signal from the respective power amplifier energy adjustment circuit varies in accordance with the output of the respective energy summer circuit.

27. The RF control system of claim 23 wherein the RF delivery coordination module controls the phase between respective pairs of RF power supplies.

28. The RF control system of claim 23 wherein the RF delivery coordination module controls the phase between respective pairs of RF power supplies in accordance with a timing signal, and the phase is determined relative to the timing signal.

29. A radio frequency (RF) control system comprising:
a plurality of power amplifiers that outputs a respective pulsed RF signal to a load, each power amplifier including:
a power amplifier that outputs a RF signal to a load;
an energy detection circuit determining an energy of the RF signal in accordance with a sensor signal that varies in accordance with the RF signal; and
a power amplifier energy adjustment circuit generating a control signal for varying the RF signal in accordance with the energy determined by the energy detection circuit;
a RF delivery coordination module, the RF delivery coordination module synchronizing the respective RF power supplies.

30. The RF control system of claim 29 wherein each respective RF signal includes a respective first signal and a respective modulation signal modulating the respective first signal and wherein the energy detection circuit determines the energy of the respective modulation signal to determine the energy of the respective RF signal.

31. The RF control system of claim 30 wherein the respective energy detection circuit determines the energy of the respective modulation signal in blocks, wherein each block is a predetermined length of time, and the energy for the respective RF signal is determined by adding the energy determined for each block.

32. The RF control system of claim 29 wherein the RF delivery coordination module synchronizes the modulation signal for each of the plurality of power amplifiers.

33. The RF control system of claim 29 wherein the modulation signal has the shape of at least one of a square wave, a sawtooth, a sinusoidal signal, exponential, Gaussian, or a combination thereof.

34. The RF control system of claim 29 wherein the RF delivery coordination module controls the phase between respective pairs of RF power supplies.

35. The RF control system of claim 29 wherein the RF delivery coordination module controls the phase between respective pairs of RF power supplies in accordance with a timing signal, and the phase is determined relative to the timing signal.

36. The RF control system of claim 29 wherein the RF delivery coordination module further controls a phase between the RF signal and the control signal.

37. The RF control system of claim 36 wherein the control signal ceases application of the RF signal and reinitiation of the RF signal commences at one of a predetermined level or a level returning to the level when the control signal ceased application of the RF signal.

38. The RF control system of claim 37 wherein the level at which the RF signal is reinitiated varies in accordance with the energy of the RF signal for a predetermine time prior to when the ceases application of the RF signal.

* * * * *

UNITED STATES PATENT AND TRADEMARK OFFICE
CERTIFICATE OF CORRECTION

PATENT NO. : 9,509,266 B2
APPLICATION NO. : 14/324540
DATED : November 29, 2016
INVENTOR(S) : David J. Coumou et al.

Page 1 of 1

It is certified that error appears in the above-identified patent and that said Letters Patent is hereby corrected as shown below:

In the Drawings

In FIG. 1, the reference numeral 32 applied to Power Source should be replaced with reference numeral 31.

In FIG. 1, 'External Energy Setpoint Module' should read -External Energy Measurement Module-.

In FIG. 1, the reference numeral 68 applied to External Energy Measurement Module should be replaced with reference numeral 67.

In FIG. 2, the reference numeral 32 applied to Power Source should be replaced with reference numeral 31.

In FIG. 2, 'External Energy Setpoint Module' should read -External Energy Measurement Module-.

In FIG. 2, the reference numeral 68 applied to External Energy Measurement Module should be replaced with reference numeral 67.

In the Specification

Column 6, Line 15 and Column 6, Line 16 the power source reference numeral '32', each occurrence should read -31-.

Signed and Sealed this
Eighth Day of January, 2019

Andrei Iancu
*Director of the United States Patent and Trademark Office*